United States Patent [19]
Cytera et al.

[11] Patent Number: 5,298,870
[45] Date of Patent: Mar. 29, 1994

[54] VOLTAGE CONTROLLED RING OSCILLATOR HAVING DIFFERENTIAL AMPLIFIER STAGES

[75] Inventors: Christopher Cytera, Grenoble, France; Andrew M. Hall, Bristol, United Kingdom

[73] Assignee: Inmos Limited, Bristol, England

[21] Appl. No.: 908,989

[22] Filed: Jul. 6, 1992

[30] Foreign Application Priority Data

Jul. 18, 1991 [GB] United Kingdom ................. 9115585

[51] Int. Cl.[5] .......................... H03B 5/02; H03B 27/00
[52] U.S. Cl. ......................................... 331/45; 331/57; 331/60; 331/108 B; 331/177 R
[58] Field of Search ................. 331/57, 60, 45, 108 B, 331/177 R

[56] References Cited

U.S. PATENT DOCUMENTS

| | | | |
|---|---|---|---|
| 3,918,008 | 11/1975 | Walton | 331/108 B |
| 4,641,048 | 2/1987 | Pollock | 331/57 X |
| 5,012,142 | 4/1991 | Sonntag | 331/57 X |
| 5,180,994 | 1/1993 | Martin et al. | 331/57 X |
| 5,191,301 | 3/1993 | Mullgrav, Jr. | 331/57 |

FOREIGN PATENT DOCUMENTS

0316607A1 5/1989 European Pat. Off. .
0429896A2 6/1991 European Pat. Off. .
0429896A3 6/1991 European Pat. Off. .

Primary Examiner—Siegfried H. Grimm
Attorney, Agent, or Firm—Edward D. Manzo

[57] ABSTRACT

A voltage controlled oscillator comprises a plurality of differential amplification stages each arranged to introduce a phase shift between its differential input signal and its differential output signal. The frequency at which the desired phase shift occurs can be controlled by adjusting the control signal Vc. The stages are arranged such that the output of one amplifier becomes the input to the next amplifier, making the phase shift additive. Further, a phase shift of 180° may be introduced by inverting the output from one stage before inputting it to the next stage. The total phase shift introduced by the stages is 360°. In this way, an oscillating signal of varying phase shift is produced at the output of each stage. Each stage comprises a standard differential amplifier, well known in the art, having a matched pair of p-channel transistors and a matched pair of n-channel transistors. The differential input is applied to each gate of the n-channel transistor pair, and the differential output is generated at the drains of the n-channel transistor pair.

30 Claims, 3 Drawing Sheets

VOLTAGE CONTROLLED RING OSCILLATOR HAVING DIFFERENTIAL AMPLIFIER STAGES

FIELD OF THE INVENTION

This invention relates to a voltage controlled oscillator.

BACKGROUND TO THE INVENTION

A common application of a voltage controlled oscillator is in a phase locked loop. A phase locked loop comprises a phase comparator which compares the phase between a periodic incoming signal and a feedback signal. The phase comparator generates an error signal dependent on the phase difference. The error signal is passed through a filter to form a control signal for a voltage controlled oscillator which generates an output signal oscillating at a frequency dependent on the voltage of the control signal supplied from the filter to the voltage controlled oscillator.

Such loops are well known and have many applications, one of which is to increase on a chip the frequency of an external clock signal supplied to the chip. In such a case the output signal from the voltage controlled oscillator is fed back through a divide-by-n circuit to form the feedback signal for the phase comparator. The external clock signal is used as the incoming signal and the output signal from the voltage controlled oscillator (before it is fed back through the divide-by-n circuit) thus forms a periodic signal which oscillates at a selected multiple of the frequency of the incoming signal and at a fixed phase relative thereto.

Phase locked loops have been used to perform this function for some years now. However, problems have arisen when these loops are implemented on a chip with other circuitry. On chip circuitry, particularly logic circuitry, generates noise which can have a significant effect on the power supply which is required for operation of the phase locked loop. It is desirable that the phase locked loop be immune to such noise. Moreover, the stability of the loop is a function of its open loop gain which varies considerably with process and temperature conditions. It is difficult therefore to design a phase locked loop to have a particular open loop gain which will remain constant under different conditions.

An important component of a phase locked loop is the voltage controlled oscillator, and with existing designs this is also the most sensitive to noise affecting its power supply. A commonly used voltage controlled oscillator is based on a principle of operation in which a current source within the voltage controlled oscillator is controlled by the control signal for the voltage controlled oscillator to generate a current in dependence on the voltage of the control signal. The value of this current affects the rate at which a capacitor of the voltage controlled oscillator charges or discharges. On a graph of voltage against time, a ramp of a gradient depending on the current is thus generated. At the point at which this crosses a predetermined threshold, a voltage transition is generated which forms an edge of the output signal. The frequency of the output signal is related to the gradient of the ramp. If the output signal of the voltage controlled oscillator is to produce edges at fixed intervals it is important that the voltage ramp always crosses the threshold with a fixed delay from initiation of the ramp. Noise from the power supply can affect the shape of the ramp by introducing spikes or glitches so that there is no longer certainty over the time at which the ramp will cross the threshold. In these circumstances, the output signal is said to suffer from "jitter". A clock signal with jitter is unacceptable for many timing applications.

To overcome this, with some voltage controlled oscillators, a resistor is placed in one of the power supply lines to form, with capacitance between the positive and ground supply lines, a filter for filtering noise from the power supply. In this way, the voltage controlled oscillator is decoupled from the power supply. This has a disadvantage in that voltage is dropped across the resistor which reduces the supply available to the phase locked loop. As the speed requirement for the phase locked loop increases, so more current will be consumed and with this the voltage drop across the resistor will be increased, perhaps to such an extent that there will be insufficient supply to operate the phase locked loop.

It is an object of the present invention to provide a voltage controlled oscillator which is less sensitive to power supply noise. This means that the resistor included in the supply line of the power supply can be reduced in value or removed altogether. This would have the desirable result that less or no voltage would be dropped across the resistor, thus allowing the voltage controlled oscillator to consume more current and hence function at higher frequencies.

SUMMARY OF THE INVENTION

According to the present invention there is provided a controllable oscillator comprising at least three differential amplification stages, each amplification stage having first and second input terminals and first and second output terminals, the first and second input terminals of each stage being connected to the first and second output terminals of a preceding one of the amplification stages to receive a difference signal therefrom, whereby the amplification stages are connected in a loop, each stage being arranged to introduce a predetermined phase shift between said input and output difference signals, the phase shift of each amplification stage at a preset frequency and the number of amplification stages being selected so that the loop introduces a total phase shift of 360°, the preset frequency being controllable in response to a control signal applied to each amplification stage.

In the described embodiment, the oscillator comprises four such amplification stages, each introducing a phase shift of 45° at the preset frequency and the output of one of the amplification stages being inverted before being supplied to a next one of the amplification stages.

However, any suitable number of stages can be used. In particular three such amplification stages each introducing a phase shift of 60° at the preset frequency, the output of one of the amplification stages being inverted before being supplied to a next one of the amplification stages.

In the described embodiment, each amplification stage comprises first and second n-channel transistors, each having a gate electrode connected to receive a respective one of the output signals from the previous amplification stage and the sources of which are connected together and to a controllable current source and the drains of which are connected via respective load elements to a supply voltage. In this specification, the term "gate" will be understood to connote the gate electrode of the corresponding device rather than the gate region (channel region).

In one circuit each load element comprises a p-channel field effect transistor having its gate connected to its drain, its drain connected to the drain of a respective one of the n-channel field effect transistors and its source connected to the supply voltage, the output signals from each stage being taken across the drains of the p-channel transistors. In another circuit, each load element comprises an n-channel transistor having its gate and drain connected to the supply voltage and its p-well connected to its source, the output signals from each stage being taken across the sources of the n-channel transistors.

In one form the current source comprises a field effect transistor the gate of which is connected to receive said control signal, and which has a gate length selected so that the source to drain current is substantially independent of the drain voltage.

In another form, substantially immune to the effect of process variations, the current source comprises an n-channel field effect transistor having its gate connected to the gate of a further n-channel transistor, the gate of said further transistor being connected to its drain and the drain of the further transistor being connected to the drain of a p-channel field effect transistor the gate of which is connected to receive said control signal.

The oscillator can be used with first and second comparators connected across the output of each differential amplification stage in opposite senses so as to provide first and second clock signals whose frequency depends on the preset frequency.

To ensure that the oscillator operates in an a.c. mode, the outputs of one of said amplification stages can be crossed over before being connected to the inputs of the next of said amplification stages thereby to introduce a phase shift of 180°.

For a better understanding of the present invention, and to show how the same may be carried into effect, reference will now be made by way of example to the accompanying drawings.

DESCRIPTION OF THE PREFERRED EMBODIMENTS

Figure 1:
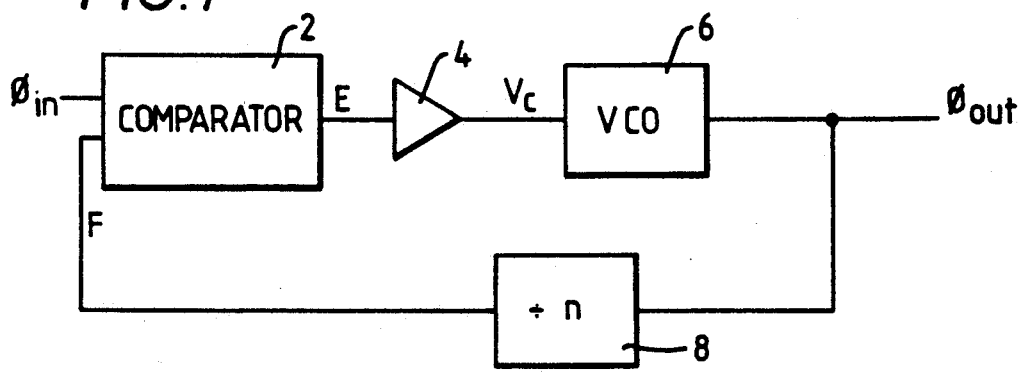
FIG. 1 is a diagram of a phase locked loop.

FIG. 1 illustrates a conventional phase locked loop. The loop comprises a comparator 2 which compares the phase between an incoming signal $\phi in$ and a feedback signal F to generate an error signal $\epsilon$ dependent on the phase difference. The error signal $\epsilon$ is fed to a low pass filter 4 which produces a control signal Vc the voltage of which is dependent upon the error signal $\epsilon$. The control voltage Vc is supplied to a voltage controlled oscillator 6, which produces an output signal $\phi out$ oscillating at a frequency dependent on the voltage of the control signal Vc. The output of the voltage controlled oscillator $\phi out$ is also fed via a divide-by n-circuit 8 to the phase comparator as the feedback signal F. The phase locked loop operates, in a manner which is well known, to hold the frequency of the output signal $\phi out$ at a fixed multiple of the frequency of the input signal $\phi in$ and with a fixed or zero phase difference relative thereto.

Figure 2:
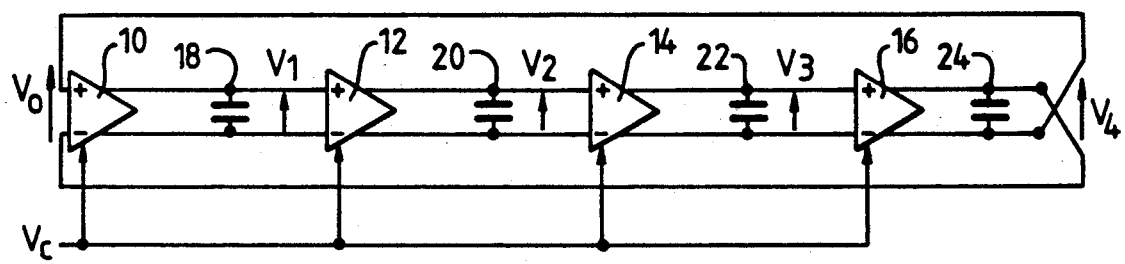
FIG. 2 is a diagram of a voltage controlled oscillator in accordance with one embodiment of the present invention.

FIG. 2 shows a voltage controlled oscillator comprising four differential amplification stages 10,12,14,16 connected in a loop. Each stage has positive and negative inputs so that the voltage input to each stage is a difference between two input values. This is termed herein a differential voltage signal. Each stage also has two outputs across which is supplied a differential output voltage signal designated $V_1, V_2, V_3, V_4$ for stages 10,12,14,16 respectively. Each of the second, third and fourth stages 12,14,16 receives at its inputs the differential signal supplied across the voltage outputs of the previous stage. The output $V_4$ of the fourth stage 16 is inverted (by crossing over the output lines of the fourth stage) before being connected to the inputs of the first stage 10 as input signal $V_o$. There is also connected across the outputs of each differential amplification stage a capacitor, 18,20,22,24 respectively. These extra capacitors may not be necessary in circumstances where the input of each differential stage itself has a high enough capacitance to cause an adequate phase shift in the output of the preceding stage as discussed hereinafter.

The oscillator is designed so that when it is supplied with power, small amplitude (for example less than about 20% of the supply voltage) sinusoidal difference signals are generated. This is achieved by ensuring that the total phase shift of the loop, that is the phase shift between output $V_4$ and input $V_o$ is 360°. In the circuit of FIG. 2, each differential amplification stage is designed to provide an output signal phase shifted by 45° at a desired frequency with respect to the input signal and to have a small signal gain greater than unity at the desired frequency. The open loop phase shift of the circuit of FIG. 2 ($V_o \rightarrow V_4$) is thus 180°. By inverting the output $V_4$ of the fourth stage 16 and feeding it back to the first stage 10 an effective further phase lag of 180° is introduced. It will be appreciated that the phase shifts referred to herein are phase lags, but that the minus sign normally used to denote a phase lag is not used herein. The end result is that each differential amplification stage produces a differential output signal varying at the same frequency as the signal input to it but phase shifted by 45°. The frequency is controlled by the voltage of the control signal Vc which is fed to each stage.

By arranging for each stage to receive and supply difference signals, any changes in the power supply affect both inputs (or outputs) in the same way so that the effect on the differential signal is minimal. The circuit of FIG. 2 thus provides a significant advantage in reducing the effect of power supply noise.

Figure 3:
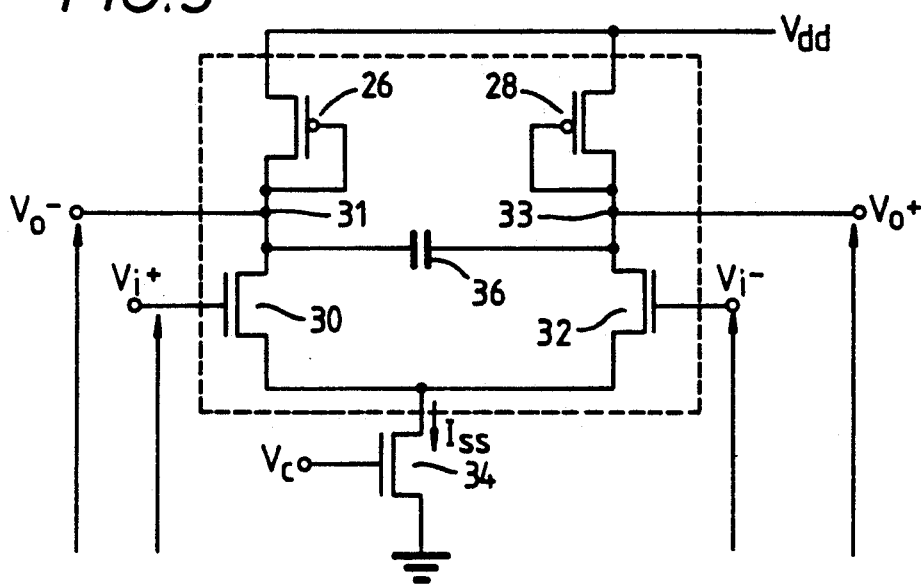
FIG. 3 is a circuit diagram of one embodiment of a stage of the voltage controlled oscillator of FIG. 2.

Changes in the power supply can however shift the quiescent bias point of the stages, that is the voltage level about which the differential signal oscillates. It is important that the characteristics of each stage are not unduly affected by changes in this voltage level, and this is generally expressed by indicating that the stage should have a high common mode rejection ratio. This is normally defined in decibels (dB) as the ratio of the differential gain to the common mode gain. FIG. 3 shows a circuit illustrating how each differential amplification stage can be implemented to satisfy this requirement. As will become apparent from the following, the circuit of FIG. 3 also has the advantage that its decisive parameters for implementation in an oscillator are largely independent of process variations.

FIG. 3 shows two p-channel field effect transistors 26,28 and two n-channel field effect transistors 30,32 connected as a long-tail pair. The p-channel transistors are matched as far as possible, as are the n-channel transistors. The sources of the p-channel transistors 26,28 are connected to a voltage supply line Vdd and their drains are connected to the drains of respective ones of the n-channel transistors 30,32. Moreover, the gates of the p-channel transistors 26,28 are connected to their drains. The sources of the n-channel transistors 30,32 are tied together and connected to the drain of an n-channel field effect control transistor 34. A capacitor 36 is connected between the drains of the n-channel transistors 30,32. The gates of the n-channel transistors 30,32 receive respectively the positive and negative input voltages $v_i+, v_i-$ supplied to each stage. The source current of the control transistor 34 is designated Iss and controls the frequency at which the desired phase shift is introduced between output and input in a manner which will be described more fully hereinafter. The control transistor 34 receives the control signal Vc at its gate. The output values $v_o-$, $v_o+$ are taken from output nodes 31,33 connected to the drains of the n-channel transistors 30,32.

Figure 4:
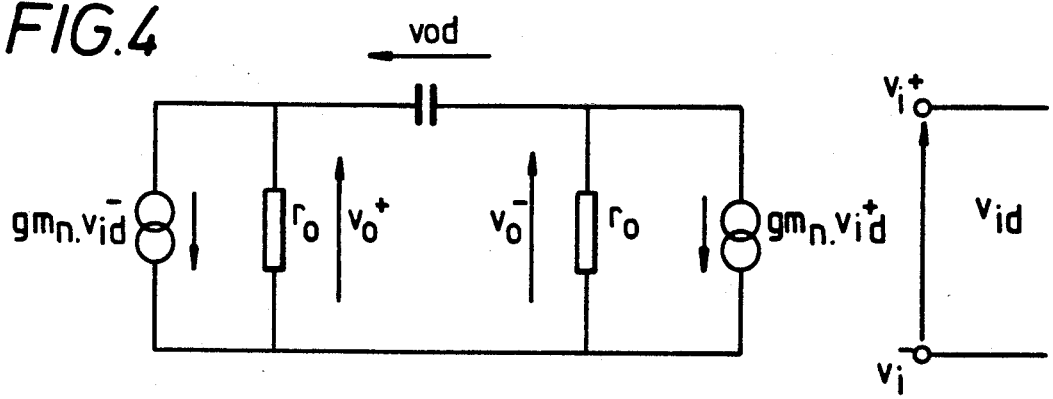
FIG. 4 is a small signal equivalent circuit of the stage of FIG. 3 of the voltage controlled oscillator.

The section of the circuit illustrated in FIG. 3 outlined with a broken line, that is comprising the n-channel transistors 30,32, the p-channel transistors 26,28 and the capacitor 36 connected across their drains can be modelled for small sinusoidal signals as shown in FIG. 4. In FIG. 4, the combination of each p-channel transistor 26,28 and its associated n-channel transistor 30,32 is modelled as a current source of value $g_{mn}v_{gs}$ (where $g_{mn}$ is the small signal transconductance of the n-channel transistor and $v_{gs}$ is the gate to source voltage of the transistor) and an output impedance $r_o$ connected in parallel with the current source. The output impedance is a function of the conductance of the n-channel and p-channel transistors $g_{dsn}$, $g_{dsp}$ and of the transconductance $g_{mp}$ of the p-channel transistors. In this circuit, $v_{gs}$ is the voltage $v_i$ applied to the gate of each n-channel transistor.

Equation 1 gives the relationship of $r_o$ to $g_{dsn}$, $g_{dsp}$ and $g_{mp}$.

$$r_o = \frac{1}{g_{dsp} + g_{dsn} + g_{mp}} \tag{1}$$

Figure 5:
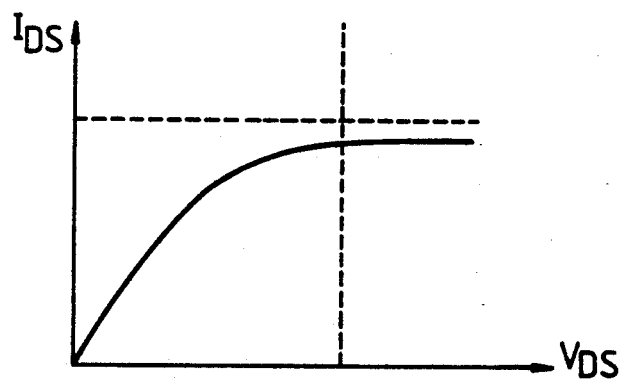
FIG. 5 is a diagram illustrating the relationship between source current Ids and drain voltage Vds in a field effect transistor.

FIG. 5 is a graph showing the relationship between the source to drain current $I_{ds}$ and the source to drain voltage $V_{ds}$ of a field effect transistor. The region to the right of the dotted line in FIG. 5 is known as the saturation region of the transistor, and in this region changes in the drain to source voltage $V_{ds}$ do not significantly affect the drain current $I_{ds}$. Thus, in the saturation region, $g_{ds}$ is small and certainly at least an order of magnitude smaller than $g_m$. As the gate length increases, the characteristic in the saturation region becomes flatter to the extent that $g_{ds}$ thus tends to zero. If the gate of the transistor is long, that is around 5 microns or greater, the drain current $I_{ds}$ is nearly independent of the source to drain voltage $V_{ds}$.

For cases where $g_{dsn}$, $g_{dsp} << g_{mp}$, Equation 1 thus approximates to $$r_o = \frac{1}{g_{mp}} \tag{1a}$$

An analysis of the equivalent circuit shown in FIG. 4 reveals that the differential output $v_{od}$ is given by:

$$v_{od} = \frac{r_o g_{mn} v_{id}}{1 + 2r_o sC} \tag{2}$$

where:

$$v_{od} = (v_o+) - (v_o-), \text{ and}$$

$$v_{id} = (v_i+) - (v_i-),$$

these variables being shown in FIG. 3.

When the circuit is in oscillation at a frequency $w_o$, $s = jw_o$. It is required that the phase shift $\arg(v_{od}/v_{id}) = -45°$. So $$\arg \frac{r_o g_{mn}}{1 + 2r_o jw_o C} = -45° \tag{3}$$

From this it can be deduced that $$w_o = \frac{1}{2r_o C} \tag{4}$$

From this, it can be seen that the oscillation frequency of the circuit can be controlled by varying the output impedance $r_o$. By substituting a value for $r_o$ from Equation 1a, $$w_o = \frac{g_{mp}}{2C} \tag{5}$$

In addition to determining the frequency at which the correct phase lag is introduced, it is necessary that the gain of each stage be set at or above unity at the frequency of oscillation. Otherwise, according to conventional control theory, there will be no oscillation. In order to achieve a perfect sinusoidal output for a sinusoidal input, the gain should be exactly one, but this is not achievable in practice. However, the gain should be designed to be as close to unity as possible.

If the effect of transistor output conductance $g_{ds}$ is ignored on the basis of the assumptions made above, at the desired frequency the a.c. gain of the circuit is given from Equation (2). Substituting Equations 1a and 4 into Equation 2 and rationalising gives:

$$\left| \frac{v_{od}}{v_{id}} \right| = \frac{g_{mn}}{g_{mp}} \sqrt{2} \tag{6}$$

The gain can thus be set by selecting the approximate relationship between the transconductance $g_{mn}$, $g_{mp}$ of the n-channel and p-channel transistors. The sizes of the transistors are thus selected so that Equation (6) gives a gain of just above unity at the quiescent bias point. Equation (6) illustrates an important feature of the circuit of FIG. 3, namely that the small signal a.c. gain does not depend on operating conditions of the circuit, and in particular is not affected by changes in the control signal Vc or by noise in the power supply.

The circuit of FIG. 3 has other important features. The frequency at which the desired phase shift between output and input is introduced is controlled by the voltage of the control signal Vc and is largely immune to power supply noise. This can be appreciated from the following explanation.

For a field effect transistor, $g_m$ is a function of the device dimensions (width, W, length, L), process parameters (mobility $\mu_o$, oxide capacitance $C_{ox}$), transistor operating region and the source current $I_{DS}$. The relation is given by Equation 7

$$\frac{1}{g_{mp}} \sqrt{\frac{L}{W\mu_o C_{ox} I_{DS} \cdot 2}} \tag{7}$$

This has some important ramifications. As illustrated by Equation (5), the frequency at which the amplification stage introduces a phase shift of 45° can be predetermined by selecting appropriate values of C and $g_{mp}$. C can be readily determined by selecting an appropriate capacitor. $g_{mp}$ depends on the parameter shown in Equation (7). The width W and length L can be set during design, and $\mu_o$ and $C_{ox}$ are constant process parameters so that the frequency $w_o$ can be finally adjusted by controlling the source current $I_{DS}$ of the p-channel transistors 26,28 to be a preset value. None of the parameters is affected by power supply noise so the frequency at which the desired phase lag is introduced is immune to variations in the power supply.

In the circuit of FIG. 3, the source current $I_{DS}$ of each p-channel transistor 26,28 is controlled to a value $I_{SS}/2$ where $I_{SS}$ is the drain current of the control transistor 34. The control signal $V_c$ is supplied to the gate of the control transistor 34. The control transistor is manufactured with a long gate (5 $\mu$m or greater) and is operated in the saturation region so that $I_{SS}$ is independent of the drain voltage (see FIG. 5 and the accompanying explanation supra), and depends substantially only on the gate voltage Vc. The frequency $w_o$ of the stage thus depends on the voltage of the control signal $V_c$.

Figure 6:
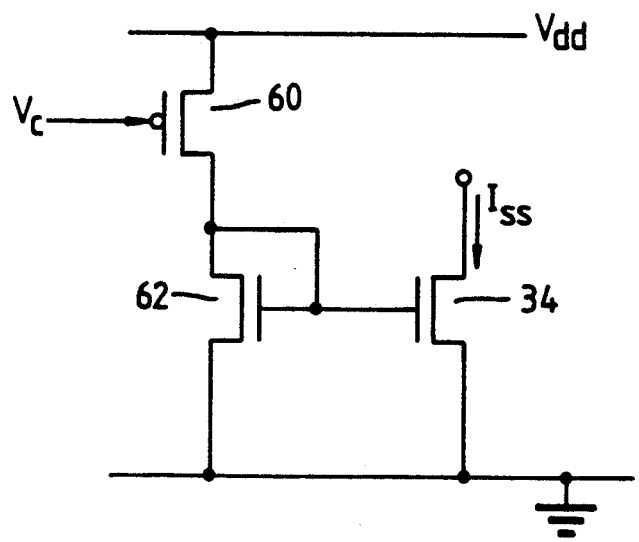
FIG. 6 shows an improved current source for use in the circuit of FIG. 3.

As explained above, the desired frequency $w_o$ depends only on the control signal $V_c$ and is largely immune to noise in the power supply. In addition to these advantages, it is possible to make the frequency $w_o$ largely independent of variations in parameters which inevitably arise during manufacture of a chip by modifying the circuit of FIG. 3 in the manner illustrated in FIG. 6. That is, instead of supplying the control signal $V_c$ directly to the gate of the control transistor 34, it is referenced to the supply volta $V_{dd}$ and supplied to the gate of a p-channel transistor 60, the width of which is n times the width of each of the p-channel transistors 26,28. The source of the transistor 60 is connected to the voltage supply $V_{dd}$ and its drain is connected to the drain of a further n-channel transistor 62. The source of the transistor 62 is connected to ground and its gate is connected both to its drain and to the gate of the control transistor 34. The process independence of the frequency $w_o$ is evident from the following explanation.

If the input capacitance of each amplification stage is sufficient to cause an adequate phase shift, so that the capacitors 18,20,22,24 are not required, then the capacitance value for the denominator of Equation (5) is $W_n L_n C_{oxn} + W_p L_p C_{oxp}$, where the subscripts m,p are the values for the n-channel and p-channel transistors respectively. Substituting Equation 7 into Equation 5 and taking into account the well known relationship between the gate voltage of a field effect transistor and its drain current, it can be shown that $$w_o = \frac{\mu_o C_{ox} W_p (V_c - V_{tp}) \sqrt{n}}{L_p \{W_n L_n C_{oxn} + W_p L_p C_{oxp}\}} \tag{8}$$

where $V_{tp}$ is the threshold voltage of the p-channel transistor 60.

The denominator of Equation 8 can be rewritten as follows:

$$L_p L_n \left( W_n C_{oxn} + W_p C_{oxp} \frac{L_p}{L_n} \right)$$

Variations in width W, length L and capacitance $C_{ox}$ of n and p-channel transistors tend to be similar for the same process variations, so the factor $$\frac{W_p C_{oxp}}{\left\{ W_n C_{oxn} + W_p C_{oxp} \frac{L_p}{L_n} \right\}} \rightarrow \text{Constant}$$

The dependance of $w_o$ on $L_n L_p$ can be reduced by keeping $L_n, L_p$ long so that process variations have a reduced effect on the magnitudes of $L_n$ and $L_p$. Therefore it can be seen to a first order that $w_o$ depends only on $\mu_o$.

An important parameter in the open loop gain of a phase locked loop is the overall gain $K_v$ of the voltage controlled oscillator. The overall gain $K_v$ of the voltage controlled oscillator is given by Equation (9).

$$K_v = \frac{dw_o}{dV_c} \tag{9}$$

where $w_o$ is in radians. The value of the gain K is the limiting factor in the design of phase locked loops, and affects the open-loop gain of the phase locked loop and thus the frequency at which the open-loop gain is one. If this is allowed to vary too widely with process variations it becomes difficult to maintain stability of the phase locked loop. The circuit of FIG. 3 considerably reduces this problem as explained in more detail below:

Taking the differential of Equation 8 it can be seen that the gain $K_v$ is set forth by the following equation 10:

$$K_v = \frac{W_p C_{oxp}}{W_p C_{oxp} \frac{L_p}{L_n} + W_n C_{oxn}} \frac{\mu_{op}}{L_p L_n} \tag{10}$$

For the reasons given above in relation to the frequency $w_o$, it can be seen that $K_v$ is largely immune to process variations. It is also self evident from Equation 10 that $K_v$ is not affected by power supply noise.

Figure 7:
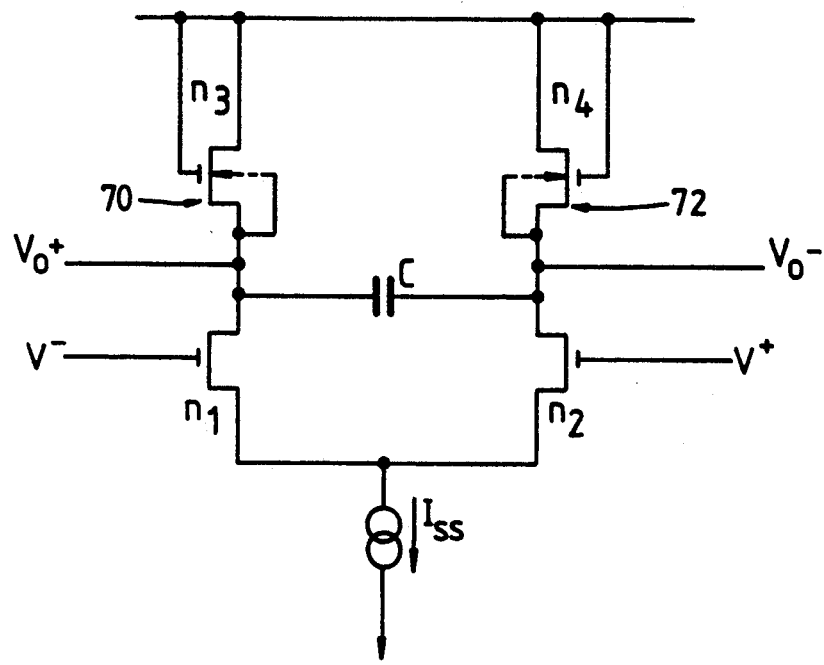
FIG. 7 is a circuit diagram of another embodiment of a stage of the voltage controlled oscillator of FIG. 2.

FIG. 7 shows an alternative differential amplification stage in which the p-channel transistors 26,28 are replaced by n-channel transistors 70,72 the gates and drains of which are connected to the supply voltage and the p-wells of which are connected to their sources and not to ground. In other respects the circuit is as described with reference to FIG. 3. This circuit is capable of producing an a.c. gain more consistently closer to unity than the circuit illustrated in FIG. 3.

Figure 8:
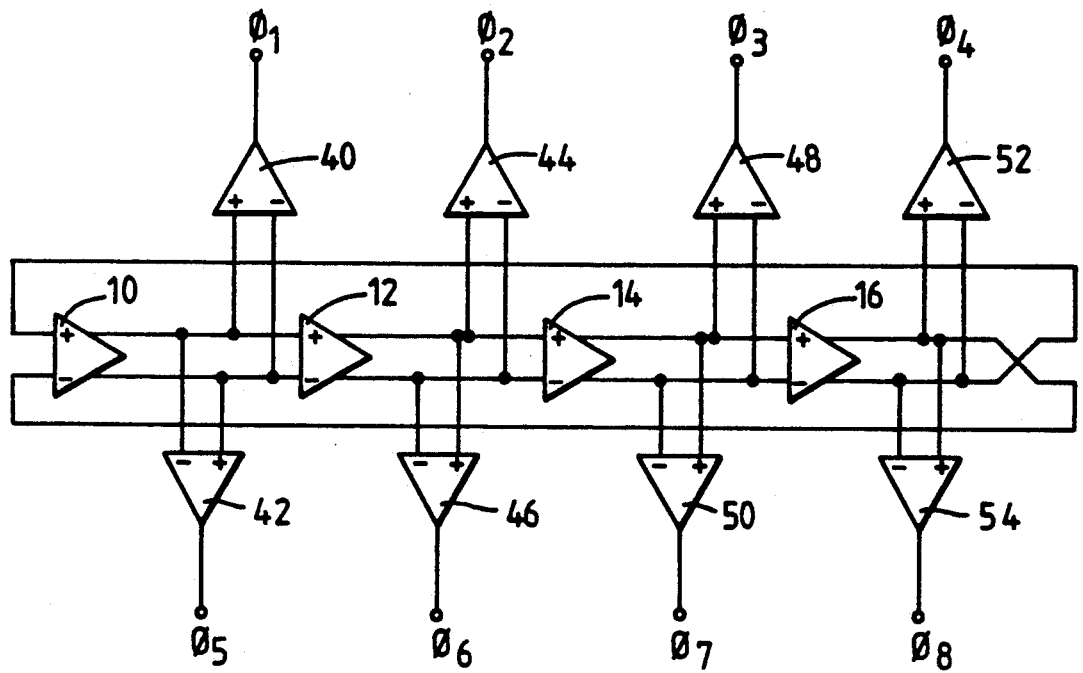
FIG. 8 is a diagram illustrating a voltage controlled oscillator capable of providing a plurality of clock signals, phase shifted relative to each other.

As described above, FIG. 2 illustrates a voltage controlled oscillator which produces across the output of each differential stage a sinusoid oscillating at the selected frequency $w_o$. FIG. 8 shows how this oscillator can be modified to produce timing edges for clocking digital circuitry. Reference numerals 40,42,44,46,48,50,52 and 54 designate comparators which are connected across the outputs of the differential amplification stage. That is, each differential amplification stage has connected across its outputs two comparators, one connected in a positive sense and one connected in a negative sense.

The comparators are conventional in that their state is switched thereby producing a timing edge each time the oscillating signal crosses zero. Preferably, the timing edges produced by the comparators have high slew rates. Inverters can be connected to the output of the comparators to act as a buffer to maintain high slew rates.

The arrangement shown in FIG. 8 is particularly useful for providing a plurality of clock signals at the same frequency but with a predetermined phase shift therebetween. In the embodiment of FIG. 8, eight clock signals can be produced with phases of 0°, 45°, 90°, 135°, 180°, 225°, 270° and 315°. Any changes to the frequency of one signal will correspond to changes in the frequency of the other signals so it is certain that the signals will always have a common frequency. Moreover, their relative phase difference always remains fixed. This has a significant advantage for timing independent logic circuitry in different parts of a chip since the frequency and phase difference can be assured.

What is claimed is:

1. A controllable oscillator comprising at least three differential amplification stages, each amplification stage having first and second input terminals and first and second output terminals, the first and second input terminals of each stage being connected to the first and second output terminals of a preceding one of the amplification stages to receive a difference signal therefrom, whereby the amplification stages are connected in a loop, each stage being arranged to introduce a predetermined phase shift between said input and output difference signals, the phase shift of each amplification stage at a preset frequency and the number of amplification stages being selected so that the loop introduces a total phase shift of 360°, the preset frequency being controllable in response to a control signal applied to each amplification stage, wherein each amplification stage comprises first and second n-channel transistors, each having a gate connected to receive a respective one of the output signals from the previous amplification stage and the sources of which are connected together and to a controllable current source and the drains of which are connected via respective load elements to a supply voltage, each load element comprising an n-channel transistor having its gate and drain connected to the supply voltage and its p-well connected to its source, the output signal from each stage being taken across the sources of the n-channel transistors.

2. An oscillator as claimed in claim 1, in which there are four such amplification stages, each introducing a phase shift of 45° at the preset frequency and the output of one of the amplification stages being inverted before being supplied to a next one of the amplification stages.

3. An oscillator as claimed in claim 1, in which there are three such amplification stages each introducing a phase shift of 60° at the preset frequency, the output of one of the amplification stages being inverted before being supplied to a next one of the amplification stages.

4. A controllable oscillator comprising at least three differential amplification stages, each amplification stage having first and second input terminals and first and second output terminals, the first and second input terminals of each stage being connected to the first and second output terminals of a preceding one of the amplification stages to receive a difference signal therefrom, whereby the amplification stages are connected in a loop, each stage being arranged to introduce a predetermined phase shift between said input and output difference signals, the phase shift of each amplification stage at a preset frequency and the number of amplification stages being selected so that the loop introduces a total phase shift of 360°, the preset frequency being controllable in response to a control signal applied to each amplification stage, wherein each amplification stage comprises first and second n-channel transistors, each having a gate connected to receive a respective one of the output signals from the previous amplification stage and the sources of which are connected together and to a controllable current source and the drains of which are connected via respective load elements to a supply voltage, each load element comprising a p-channel field effect transistor having its gate connected to its drain, its drain connected to the drain of a respective one of the n-channel field effect transistors and its source connected to the supply voltage, the output signals from each stage being taken across the drain of the p-channel transistors.

5. An oscillator as claimed in claim 1, wherein the current source comprises a field effect transistor the gate of which is connected to receive said control signal, and which has a gate length selected so that the source to drain current is substantially independent of the drain voltage.

6. An oscillator as claimed in claim 5, wherein the gate length of the field effect transistor is at least 5 microns.

7. An oscillator as claimed in claim 1, wherein the current source comprises an n-channel field effect transistor having its gate connected to the gate of a further n-channel transistor, the gate of said further transistor being connected to its drain and the drain of the further transistor being connected to the drain of a p-channel field effect transistor the gate of which is connected to receive said control signal when referenced to a supply voltage.

8. A controllable oscillator comprising at least three differential amplification stages, each amplification stage having first and second input terminals and first and second output terminals, the first and second input terminals of each stage being connected to the first and second output terminals of a preceding one of the amplification stages to receive a difference signal therefrom, whereby the amplification stages are connected in a loop, each stage being arranged to introduce a predetermined phase shift between said input and output difference signals, the phase shift of each amplification stage at a preset frequency and the number of amplification stages being selected so that the loop introduces a total phase shift of 360°, the preset frequency being controllable in response to a control signal applied to each amplification stage, said controllable oscillator further comprising first and second comparators connected across the output of each differential amplification stage in opposite senses so as to provide first and second clock signals whose frequency depends on the preset frequency.

9. An oscillator as claimed in claim 4, wherein the ratio of $$\frac{g_{nm}}{g_{mp}\sqrt{2}}$$

is selected to be as close to unity as possible where $g_{mn}$, $g_{mp}$ are the transconductances of the n-channel and p-channel transistors respectively.

10. A controllable oscillator comprising at least three differential amplification stages, each amplification stage having first and second input terminals and first and second output terminals, the first and second input terminals of each stage being connected to the first and second output terminals of a preceding one of the amplification stages to receive a difference signal therefrom, whereby the amplification stages are connected in a loop, each stage being arranged to introduce a predetermined phase shift between said input and output difference signals, the phase shift of each amplification stage at a preset frequency and the number of amplification stages being selected so that the loop introduces a total phase shift of 360°, the preset frequency being controllable in response to a control signal applied to each amplification stage, wherein each amplification stage comprises first and second n-channel transistors, each having a gate connected to receive a respective one of the output signals from the previous amplification stage and the sources of which are connected together and to a controllable current source and the drains of which are connected via respective load elements to a supply voltage, wherein a capacitor is connected across the output of each stage.

11. An oscillator as claimed in claim 4, wherein the current source comprises a field effect transistor the gate of which is connected to receive said control signal, and which has a gate length selected so that the source to drain current is substantially independent of the drain voltage.

12. An oscillator as claimed in claim 4, wherein the current source comprises an n-channel field effect transistor having its gate connected to the gate of a further n-channel transistor, the gate of said further transistor being connected to its drain and the drain of the further transistor being connected to the drain of a p-channel field effect transistor the gate of which is connected to receive said control signal when referenced to a supply voltage.

13. A controllable oscillator comprising at least three differential amplification stages, each amplification stage having first and second input terminals and first and second output terminals, the first and second input terminals of each stage being connected to the first and second output terminals of a preceding one of the amplification stages to receive a difference signal therefrom, whereby the amplification stages are connected in a loop, each stage being arranged to introduce a predetermined phase shift between said input and output difference signals, the phase shift of each amplification stage at a preset frequency and the number of amplifications stages being selected so that they loop introduces a total phase shift of 360°, the preset frequency being controllable in response to a control signal applied to each amplification stage, wherein each amplification stage comprises first and second n-channel transistors, each having a gate connected to receive a respective one of the output signals from the previous amplification stage and the sources of which are connected together and to a controllable current source and the drains of which are connected via respective load elements to a supply voltage, wherein the current source comprises a field effect transistor the gate of which is connected to receive said control signal and which has a gate length selected so that the source to drain current is substantially independent of the drain voltage.

14. An oscillator as claimed in claim 13 wherein the gate length of the field effect transistor is at least 5 microns.

15. A controllable oscillator comprising at least three differential amplification stages, each amplification stage having first and second input terminals and first and second output terminals, the first and second input terminals of each stage being connected to the first and second output terminals of a preceding one of the amplification stages to receive a difference signal therefrom, whereby the amplification stages are connected in a loop, each stage being arranged to introduce a predetermined phase shift between said input and output difference signals, the phase shift of each amplification stage at a preset frequency and the number of amplification stages being selected so that the loop introduces a total phase shift of 360°, the preset frequency being controllable in response to a control signal applied to each amplification stage, wherein each amplification stage comprises first and second n-channel transistors, each having a gate connected to receive a respective one of the output signals from the previous amplification stage and the sources of which are connected together to a controllable current source and the drains of which are connected via respective load elements to a supply voltage, wherein the current source comprises an n-channel field effect transistor having its gate connected to the gate of a further n-channel transistor, the gate of said further transistor being connected to its drain and the drain of the further transistor being connected to the drain of a p-channel field effect transistor the gate of which is connected to receive said control signal when referenced to a supply voltage.

16. An oscillator as claimed in claim 1 comprising first and second comparators connected across the output of each differential amplification stage in opposite senses so as to provide first and second clock signals whose frequency depends on the preset frequency.

17. An oscillator as claimed in claim 4 comprising first and second comparators connected across the output of each differential amplification stage in opposite senses so as to provide first and second clock signals whose frequency depends on the preset frequency.

18. An oscillator as claimed in claim 13 comprising first and second comparators connected across the output of each differential amplification stage in opposite senses so as to provide first and second clock signals whose frequency depends on the preset frequency.

19. An oscillator as claimed in claim 15 comprising first and second comparators connected across the output of each differential amplification stage in opposite senses so as to provide first and second clock signals whose frequency depends on the preset frequency.

20. An oscillator as claimed in claim 1 wherein a capacitor is connected across the output of each stage.

21. An oscillator as claimed in claim 4 wherein a capacitor is connected across the output of each stage.

22. An oscillator as claimed in claim 13 wherein a capacitor is connected across the output of each stage.

23. An oscillator as claimed in claim 15 wherein a capacitor is connected across the output of each stage.

24. An oscillator as claimed in claim 8 in which there are four such amplification stages, each introducing a phase shift of 45° at the preset frequency and the output of one of the amplification stages being inverted before being supplied to a next one of the amplification stages.

25. An oscillator as claimed in claim 8 wherein each amplification stage comprises first and second n-channel transistors, each having a gate connected to receive a respective one of the output signals from the previous amplification stage and the sources of which are connected together and to a controllable current source and the drains of which are connected via respective load elements to a supply voltage.

26. An oscillator as claimed in claim 25 wherein each load element comprises an n-channel transistor having its gate and drain connected to the supply voltage and its p-well connected to its source, the output signal from each stage being taken across the sources of the n-channel transistors.

27. An oscillator as claimed in claim 25 wherein each load element comprises a p-channel field effect transistor having its gate connected to its drain, its drain connected to the drain of a respective one of the n-channel field effect transistors and its source connected to the supply voltage, the output signals from each stage being taken across the drains of the p-channel transistors.

28. An oscillator as claimed in claim 25 wherein the current source comprises a field effect transistor the gate of which is connected to receive said control signal, and which has a gate length selected so that the source to drain current is substantially independent of the drain voltage.

29. An oscillator as claimed in claim 28 wherein the gate length of the field effect transistor is at least 5 microns.

30. An oscillator as claimed in claim 25 wherein the current source comprises an n-channel field effect transistor having its gate connected to the gate of a further n-channel transistor, the gate of said further transistor being connected to its drain and the drain of the further transistor being connected to the drain of a p-channel field effect transistor the gate of which is connected to receive said control signal when referenced to a supply voltage.

* * * * *